United States Patent [19]

Sugawara et al.

[11] Patent Number: 5,045,804
[45] Date of Patent: Sep. 3, 1991

[54] AMPLIFYING CIRCUIT

[75] Inventors: Mitsutoshi Sugawara; Shinji Nozawa, both of Tokyo, Japan

[73] Assignee: NEC Corporation, Japan

[21] Appl. No.: 436,449

[22] Filed: Nov. 14, 1989

[30] Foreign Application Priority Data

Nov. 14, 1988 [JP] Japan .................................. 63-288589

[51] Int. Cl.⁵ ............................................. H03K 17/56
[52] U.S. Cl. ..................................... 330/51; 307/243; 328/154; 330/295
[58] Field of Search ...................... 330/51, 124 R, 252, 330/295; 307/243; 328/154; 370/27, 112

[56] References Cited

U.S. PATENT DOCUMENTS 3,594,590 7/1971 Smith .................................. 307/243
4,581,541 4/1986 Nakayama et al. ................. 307/243

Primary Examiner—James B. Mullins
Attorney, Agent, or Firm—Ostrolenk, Faber, Gerb & Soffen

[57] ABSTRACT

An amplifying circuit has a plurality of first signal input circuits for multi-channel input, a signal output circuit receptive commonly of outputs of these signal input circuits, and a switching circuit for selecting one of the first signal input circuits. A second signal input circuit has an input terminal held at a fixed potential and an output terminal connected to the signal output circuit and is operative during a selecting transient period of the plurality of first signal input circuits.

7 Claims, 6 Drawing Sheets

AMPLIFYING CIRCUIT

BACKGROUND OF THE INVENTION

The present invention relates to structure of an amplifying circuit, and more specifically relates to a particular amplifying circuit of multi-channel input and single-output type.

Conventionally, this type of the amplifying circuit is constructed in view of the multi-channel input and single-output type such that when selecting a particular channel, only the selected channel is biased and the other nonselected channels are not biased.

The drawings are referred to for detailed description of the prior art, in which FIG. 1 shows a schematic structure of the prior art, FIG. 2 shows a circuit of the FIG. 1 prior art and FIG. 3 is a timing chart of switching operation in the FIG. 2 circuit. Referring to FIG. 2, for instance, A channel is initially selected and next, is switched to B channel. In such case, as shown in FIG. 2, a base potential $V_A$ of transistor Tr5 and another base potential $V_B$ of transistor Tr6 are falling and rising, respectively, in illustrated timings. At this time, a collector potential of transistor Tr9 is lowered during a period Td shown in FIG. 3, in which none of the channels is operated, and therefore a collector current of transistor Tr9 is reduced so that a flowing current is reduced through load resistors $R_3$ and $R_4$ within an output circuit, thereby causing transient noise.

The above described conventional amplifying circuit of the multi-channel input and single-output type is constructed such that when selecting a particular channel, only the selected channel is biased and the remaining channels are not biased. Therefore, during the switching of channels, one channel which has been selected before the switching is firstly made nonoperative and then another newly selected channel is made operative, thereby causing a time delay in which none of the channels momentarily operates. As a result, a transient noise may be generated at an output terminal to thereby impart bad influence to a circuit subsequently connected to the amplifying circuit.

SUMMARY OF THE INVENTION

An object of the invention is to, therefore, eliminate transient noise at the output terminal of the amplifying circuit. According to the present invention, the amplifying circuit has a dummy channel provided with an input terminal held at a fixed potential and an output terminal connected commonly to those of other channels, and designed to be selected when all of the other channels are made nonoperative during the switching of channels.

DETAILED DESCRIPTION OF EMBODIMENT

Figure 1:
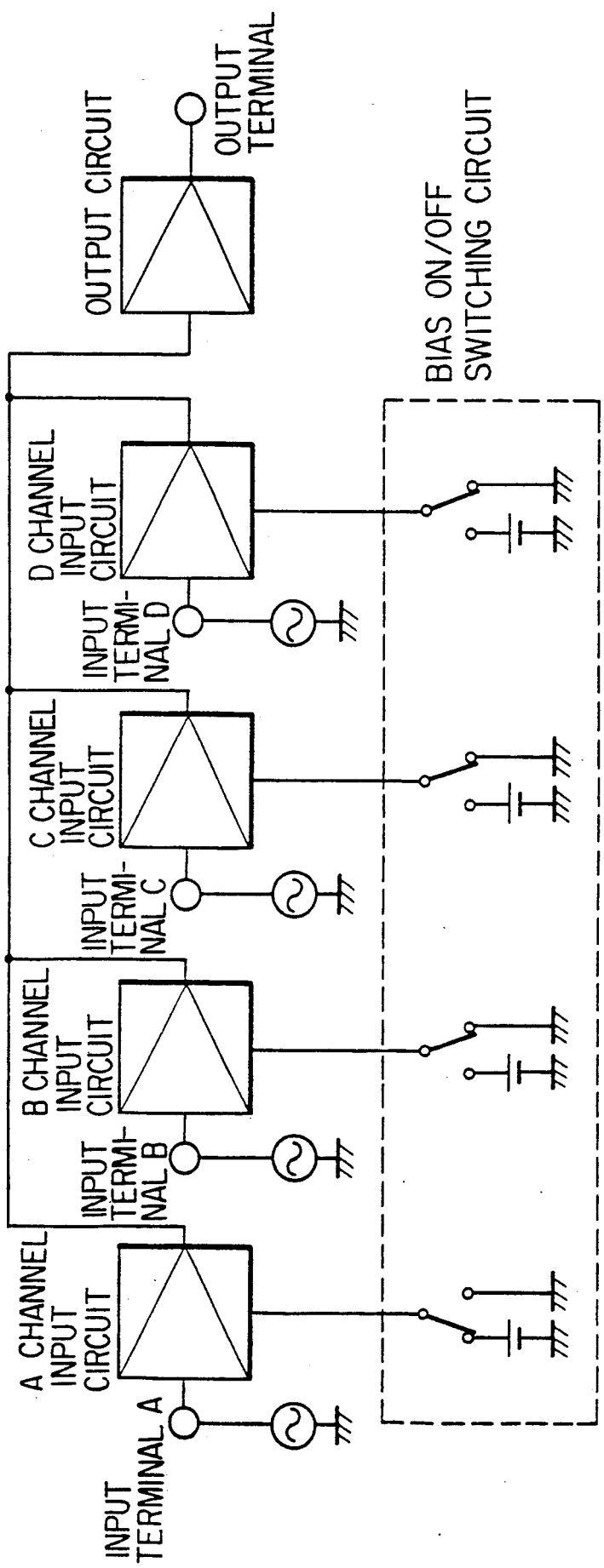
FIG. 1 is a structural diagram of the prior art.
Figure 2:
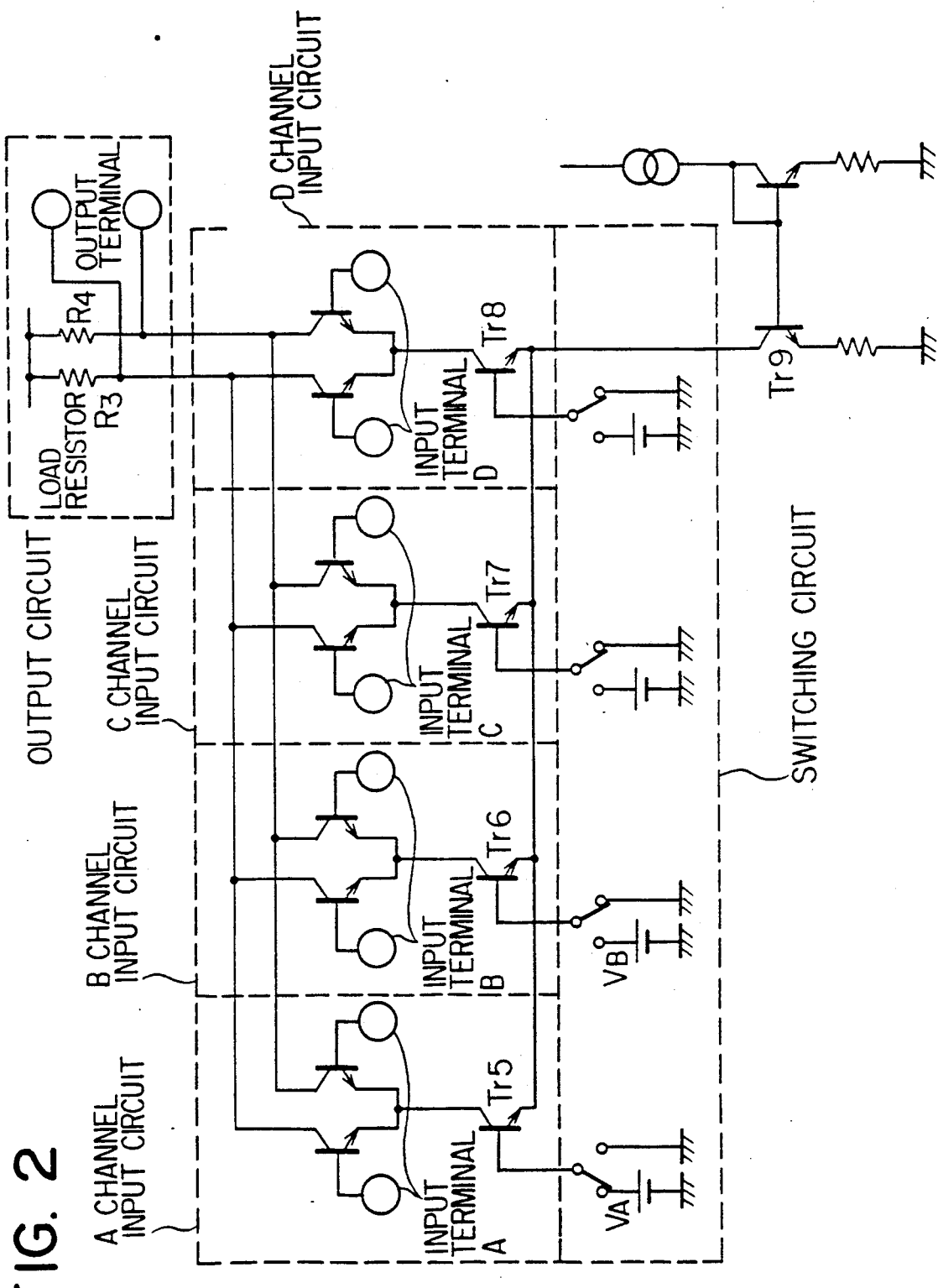
FIG. 2 is a circuit diagram of the prior art.
Figure 3:
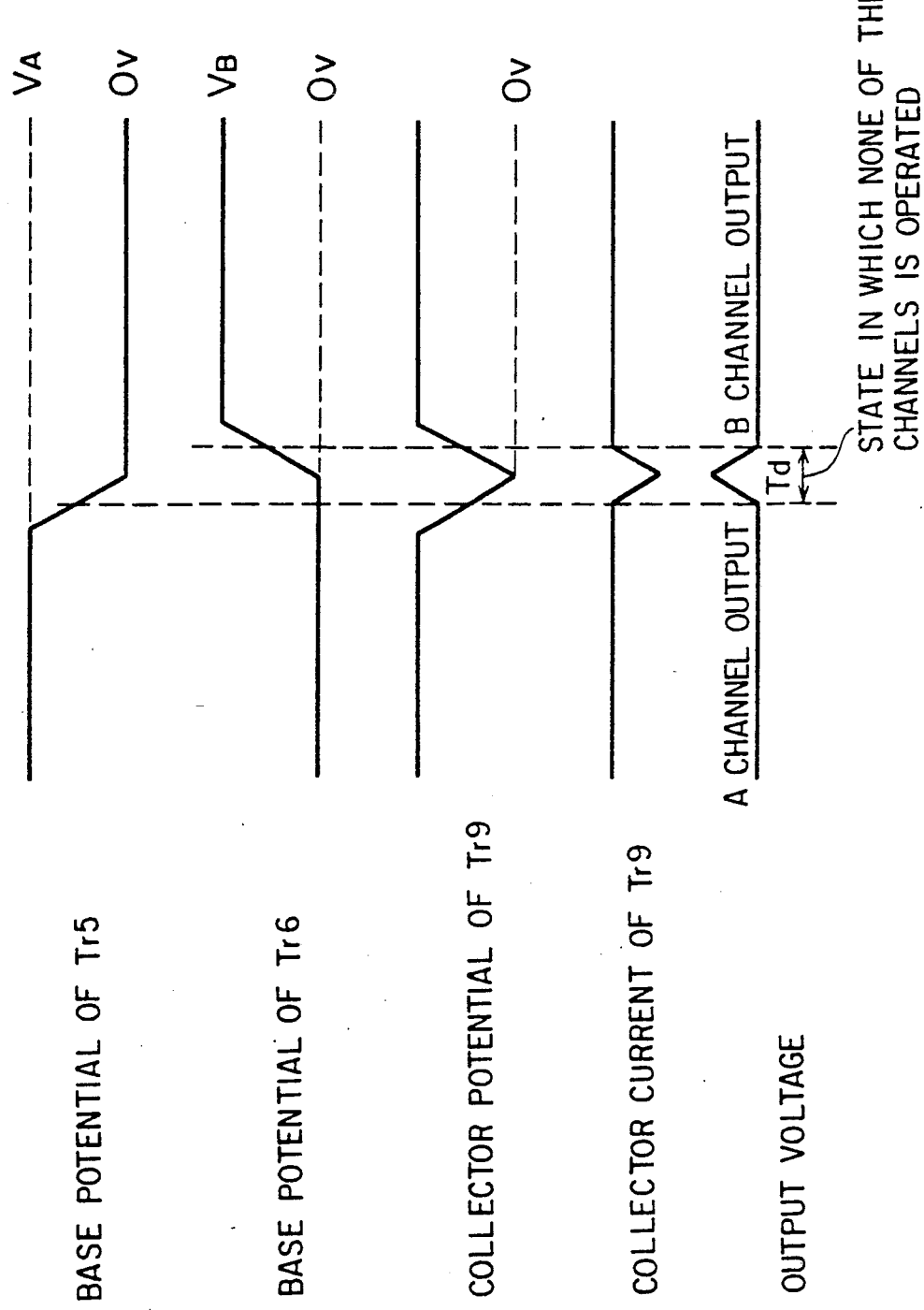
FIG. 3 is a timing chart of channel switching in the FIG. 2 circuit.
Figure 4:
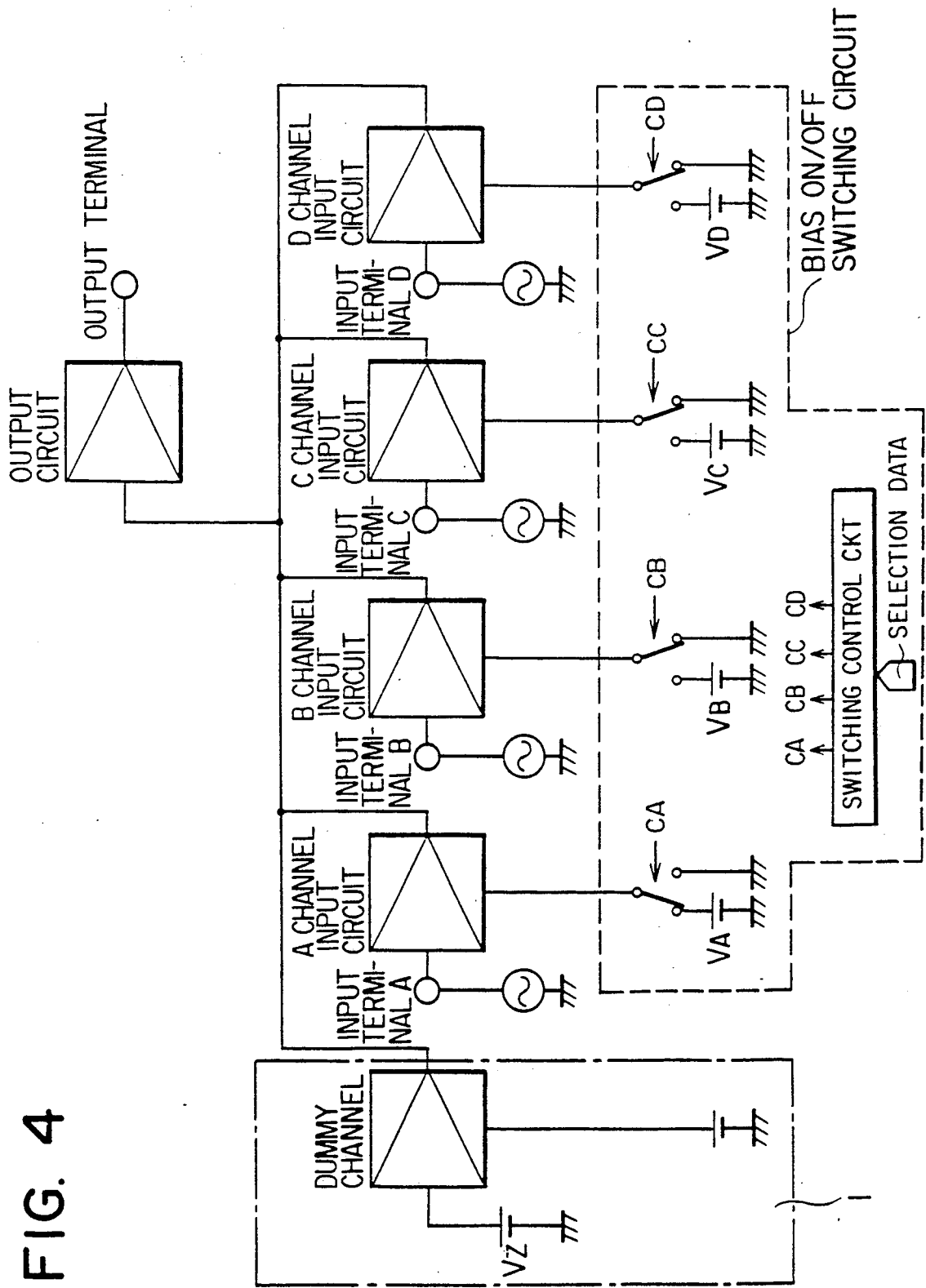
FIG. 4 is a block diagram showing one embodiment of the present invention.
Figure 5:
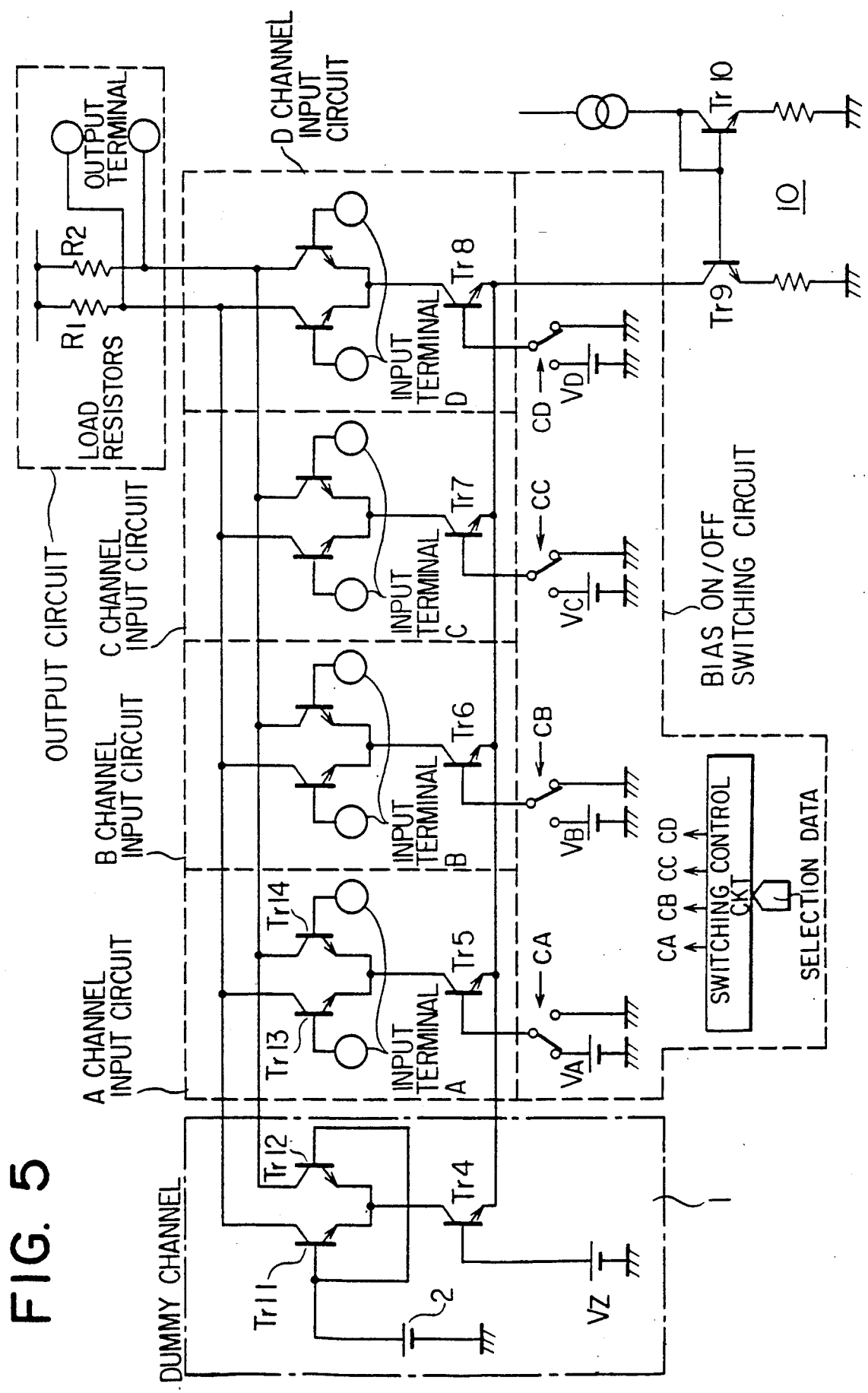
FIG. 5 is a circuit diagram of the FIG. 4 embodiment.

Next, the present invention is described with reference to the drawings. FIG. 4 is a block diagram of one embodiment according to the present invention and FIG. 5 is a circuit diagram thereof. In FIGS. 4 and 5, a dummy channel 1 is provided according to the present invention and is indicated as a portion enclosed by dot and chain line. In FIG. 5, a portion enclosed by dashed line has a structure identical to that of the conventional circuit, including A channel input circuit, B channel input circuit, C channel input circuit, D channel input circuit and switching circuit. The current switch transistors Tr5, Tr6, Tr7 and Tr8 of the respective channel input circuits are fed at their bases with base bias voltages $V_A$, $V_B$, $V_C$ and $V_D$, respectively, during their active states. These bias voltages $V_A$ through $V_D$ are generated from corresponding bias circuits which have the same structure, hence these bias voltages are set to the identical value with each other. Instead, these may be set to different values optimum to the respective channels. Further, in the dummy channel 1, the current switch transistor Tr4 is fed with a base bias voltage $V_Z$ which is set to a value lower than any of the bias voltages $V_A$, $V_B$, $V_C$ and $V_D$. The switching circuit is provided with a switching control circuit. The switching control circuit makes one of the control signal lines CA-CD active level, responding to a selection data, so that the corresponding current switch transistor is made conductive.

A channel input circuit has two transistors Tr13 and Tr14 connected with each other to form differential circuit, and a current switch transistor Tr5 through which the above two transistors Tr13 and Tr14 are connected to the current source and whose base is connected to a bias voltage $V_A$ of the switching circuit. B, C, and D channel input circuits have the same structure as A channel input circuit, respectively. When the bias voltage $V_A$ is fed to base of the transistor Tr5, a current from the current source 10 is fed as an operating current through the transistor Tr5 to the two transistors Tr13 and Tr14, in which when input signal is fed to input terminal A, the voltage of the input signal is amplified and the voltage amplified is generated between output terminals.

A dummy channel has two transistors Tr11 and Tr12 each of whose collectors is connected to a load circuit, a power 2 for dummy channel connected to bases of the above two transistors Tr11 and Tr12, another transistor Tr4 through which emitters of the above two transistors Tr11 and Tr12 is connected to a current source, and a voltage $V_Z$ which is connected to base of the another transistor Tr4. Said voltage $V_Z$ renders said the transistor Tr4 conductive in a transient period in which the content of said selection data changes, that is when switching is effected from one channel to another channel, by which variation of the collector current of the transistor Tr9 of the bias current source 10 is removed.

Figure 6:
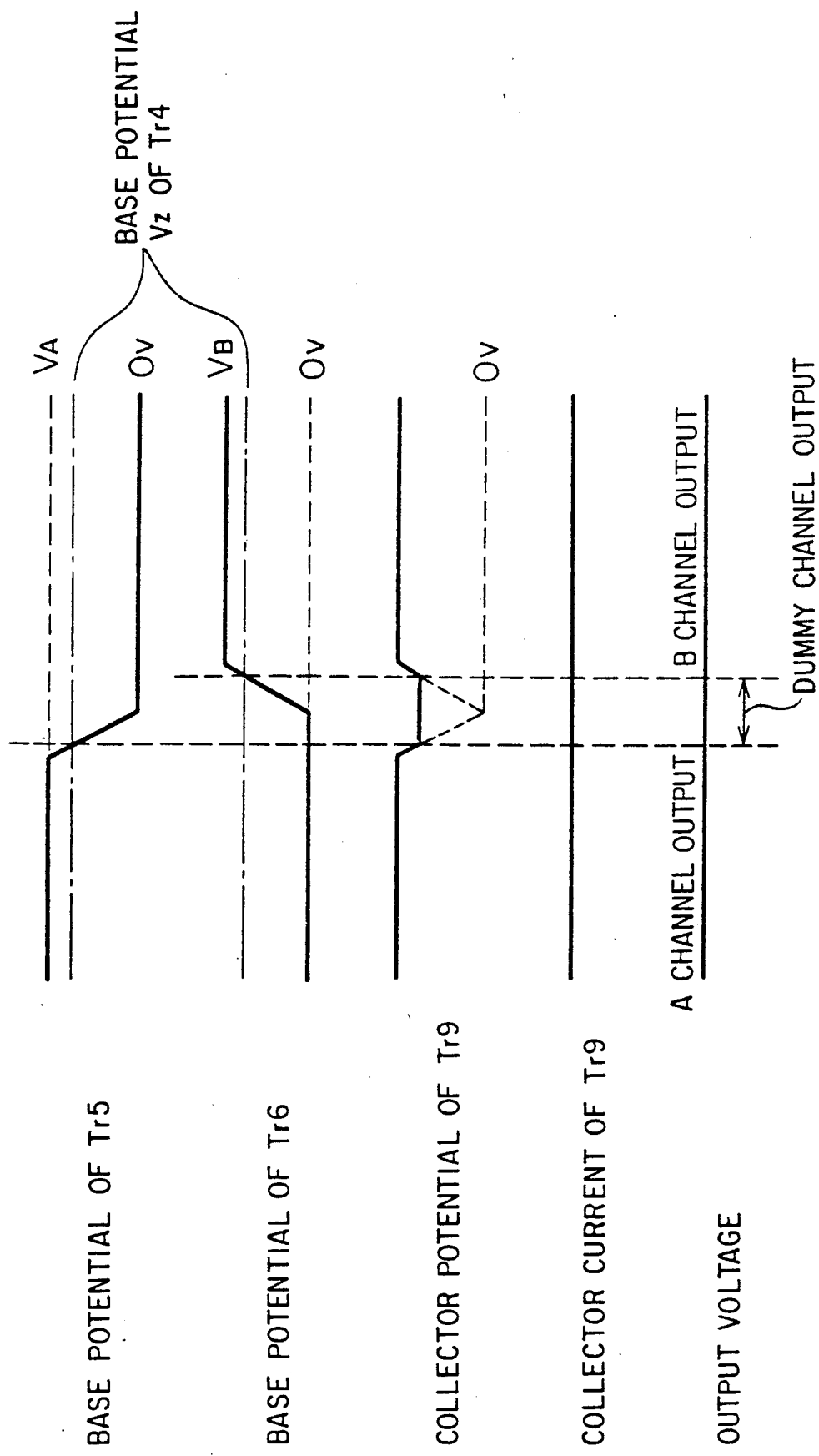
FIG. 6 is a timing chart of channel switching in the FIG. 5 circuit.

Accordingly, as shown by switching timing of FIG. 6, when switching is effected from A channel to B channel, the transistor Tr4 starts to operate during the course of falling of $V_A$ and stops operating when $V_B$ rises. As a result, the lowering of the collector voltage can be effectively suppressed in the transistor Tr9 of the bias current source 10 to thereby remove variation of the collector current of the transistor Tr9. Consequently, the flowing current is not changed through the load resistors R1 and R2 of the output circuit to thereby reduce the generation of transient noise.

As described above, according to the present invention, the amplifying circuit of the multi-channel input and single-output type is provided with the dummy channel effective to reduce transient noise which would be generated at the time of the channel switching.

What is claimed is:

1. An amplifying circuit comprising a plurality of signal input circuits for multi-channel input, each of which receives a corresponding signal input, a load circuit commonly connected to the outputs of the signal input circuits, an output terminal connected to said load circuit, a current source responsive to a voltage being applied thereto for supplying a current, selecting means for selectively connecting said current source to one of said signal input circuits and for applying a voltage to said current source in response to selection data, said voltage lowering during a transient period in which said selection data changes, and dummy channel means connected to said load circuit and said current source and responsive to said lowering of voltage during said transient period to connect said current source to said load circuit without passing through said signal input circuits.

2. An amplifying circuit according to claim 1, wherein said dummy channel means includes a differential type transistor circuit connected to said load circuit and an additional transistor responsive to lowering of said voltage for connecting said current source with said differential type transistor circuit to supply current to said load circuit.

3. An amplifying circuit according to claim 1, wherein said selecting means includes respective switch transistors for each signal input circuit, each switch transistor being connected to said current source for applying a voltage thereto when said switch transistor is rendered conductive, and means for selectively applying a voltage to each switch transistor to render said switch transistor conductive and thereby apply a voltage to said current source.

4. An amplifying circuit according to claim 3, wherein said dummy channel means includes a differential type transistor circuit connected to said load circuit and an additional transistor responsive to lowering of said voltage for connecting said current source with said differential type circuit to supply current to said load circuit.

5. An amplifying circuit according to claim 4, wherein the voltage applied to each switch transistor is a bias voltage and wherein means are provided for applying a bias voltage to said additional transistor, which is lower than the bias voltage applied to any of said switch transistors.

6. An amplifying circuit comprising a plurality of signal input circuits each of which has a first transistor and a second transistor connected with each other to form a differential type circuit, input means for respectively applying a corresponding input signal to the bases of the first and the second transistors, load circuits, connection means which commonly connect said signal input circuits with said load circuits, a current source, a plurality of third transistors through each of which said current source is connected to a common emitter point of said first and second transistors, selecting means responsive to selection data for making one of the third transistors conductive, fourth transistors whose collectors are connected respectively to said load circuits and whose bases are connected to a source of bias current, a fifth transistor through which the emitters of said fourth transistors are connected to said current source and means which renders said fifth transistor conductive in a transient period in which the content of said selection data changes.

7. An amplifying circuit according to claim 6, wherein said means for making one of said third transistors conductive includes means for providing a bias voltage to said third transistor and said means which renders said fifth transistor conductive includes means for applying a bias voltage to said fifth transistor lower than the bias voltage applied to said third transistor.

* * * * *